United States Patent
Wang et al.

(10) Patent No.: US 11,742,295 B2
(45) Date of Patent: Aug. 29, 2023

(54) INTERFACE OF INTEGRATED CIRCUIT DIE AND METHOD FOR ARRANGING INTERFACE THEREOF

(71) Applicants: Global Unichip Corporation, Hsinchu (TW); Taiwan Semiconductor Manufacturing Company, Ltd., Hsinchu (TW)

(72) Inventors: Ting-Hao Wang, Hsinchu (TW); Ting-Chin Cho, Hsinchu (TW); Igor Elkanovich, Hsinchu (TW); Amnon Parnass, Hsinchu (TW); Chia-Hsiang Chang, Hsinchu (TW); Tsai-Ming Yang, Hsinchu (TW); Yen-Chung T. Chen, Santa Clara, CA (US); Ting-Hsu Chien, Hsinchu (TW); Yuan-Hung Lin, Hsinchu (TW); Chao-Ching Huang, Hsinchu (TW); Li-Ya Tseng, Hsinchu (TW); Pei Yu, Hsinchu (TW); Jia-Liang Chen, Hsinchu (TW); Yen-Wei Chen, Hsinchu (TW); Chung-Kai Wang, Hsinchu (TW); Chun-Hsu Chen, Hsinchu (TW); Yu-Ju Chang, Hsinchu (TW); Li-Hua Lin, Hsinchu (TW); Zanyu Yang, Hsinchu (TW)

(73) Assignees: Global Unichip Corporation, Hsinchu (TW); Taiwan Semiconductor Manufacturing Company, Ltd., Hsinchu (TW)

(*) Notice: Subject to any disclaimer, the term of this patent is extended or adjusted under 35 U.S.C. 154(b) by 173 days.

(21) Appl. No.: 17/134,534

(22) Filed: Dec. 28, 2020

(65) Prior Publication Data
US 2022/0208684 A1 Jun. 30, 2022

(51) Int. Cl.
*H01L 23/538* (2006.01)
*H01L 23/00* (2006.01)
(Continued)

(52) U.S. Cl.
CPC .......... *H01L 23/5386* (2013.01); *H01L 24/06* (2013.01); *H01L 25/0655* (2013.01);
(Continued)

(58) Field of Classification Search
CPC ................. H01L 23/5386; H01L 24/06; H01L 23/49833; H01L 2224/0613;
(Continued)

(56) References Cited

U.S. PATENT DOCUMENTS 5,629,950 A * 5/1997 Godiwala ........... G06F 11/1064
714/805
9,766,288 B2 9/2017 Huang et al.
(Continued)

FOREIGN PATENT DOCUMENTS

DE 102018106508 6/2019
DE 102020119103 3/2021
TW I700641 8/2020

OTHER PUBLICATIONS

"Office Action of Taiwan Counterpart Application", dated Sep. 27, 2022, p. 1-p. 7.
(Continued)

*Primary Examiner* — Ahmed N Sefer
(74) *Attorney, Agent, or Firm* — JCIPRNET

(57) ABSTRACT

An interface of integrated circuit (IC) die includes a plurality of the contact elements formed as a contact element pattern corresponding to a parallel bus. The contact elements are arranged in an array of rows and columns and divided into a transmitting group and a receiving group. The contact elements of the transmitting group have a first contact
(Continued)

| VSS | T_D0 | T_D7 | T_D11 | VDDP | T_PAR | T_D26 | T_FC1 | VSS | R_D25 | R_D19 | R_D15 | VDDP | R_D6 | R_DBI3 |
|---|---|---|---|---|---|---|---|---|---|---|---|---|---|---|
| T_DBI0 | T_D1 | VSS | T_D12 | T_D16 | T_D20 | VDDP | T_FC0 | R_D29 | R_D24 | VSS | R_D14 | R_D10 | R_D5 | VDDP |
| VDDP | T_LR0 | T_D8 | T_FR | VSS | T_D21 | T_D27 | T_D30 | VDDP | R_LR1 | R_D18 | R_D13 | VSS | R_D4 | R_DBI2 |
| T_DBI1 | T_D2 | VDDP | T_DCKP | T_D17 | T_D22 | VSS | T_D31 | R_D28 | R_D23 | VDDP | R_DCKN | R_D9 | R_D3 | VSS |
| VSS | T_D3 | T_D9 | T_DCKN | VDDP | T_D23 | T_D28 | R_D31 | VSS | R_D22 | R_D17 | R_DCKP | VDDP | R_D2 | R_DBI1 |
| T_DBI2 | T_D4 | VSS | T_D13 | T_D18 | T_LR1 | VDDP | R_D30 | R_D27 | R_D21 | VSS | R_FR | R_D8 | R_LR0 | VDDP |
| VDDP | T_D5 | T_D10 | T_D14 | VSS | T_D24 | T_D29 | R_FC0 | VDDP | R_D20 | R_D16 | R_D12 | VSS | R_D1 | R_DBI0 |
| T_DBI3 | T_D6 | VDDP | T_D15 | T_D19 | T_D25 | VSS | R_FC1 | R_D26 | R_PAR | VDDP | R_D11 | R_D7 | R_D0 | VSS | element sequence and the contact elements of the receiving group have a second contact element sequence, the first contact element sequence is identical to the second contact element sequence. The contact elements with the first contact element sequence and the second contact element sequence are matched when the contact element pattern is geometrically rotated by 180° with respect to a row direction and a column direction.

18 Claims, 6 Drawing Sheets

(51) Int. Cl.
    *H01L 25/065*     (2023.01)
    *H01L 23/498*     (2006.01)

(52) U.S. Cl.
    CPC .. *H01L 23/49816* (2013.01); *H01L 23/49833* (2013.01); *H01L 23/5383* (2013.01); *H01L 23/5384* (2013.01); *H01L 23/5385* (2013.01); *H01L 24/16* (2013.01); *H01L 2224/0613* (2013.01)

(58) Field of Classification Search
    CPC ........... H01L 23/49816; H01L 23/5383; H01L 23/5384; H01L 23/5385
    See application file for complete search history.

(56) References Cited

U.S. PATENT DOCUMENTS

| | | | |
|---|---|---|---|
| 10,037,293 | B2 | 7/2018 | Chen et al. |
| 10,127,169 | B2 | 11/2018 | Su |
| 10,152,445 | B2 | 12/2018 | Su |
| 10,153,006 | B2 * | 12/2018 | Hamada .................. G11C 5/02 |
| 10,261,928 | B2 | 4/2019 | Chen et al. |
| 10,515,939 | B2 * | 12/2019 | Chen ................... H01L 25/0655 |
| 2007/0205483 | A1 * | 9/2007 | Williams ............ H01L 29/0665 |
| | | | 977/700 |
| 2015/0198971 | A1 | 7/2015 | Crisp et al. |
| 2016/0035656 | A1 * | 2/2016 | Haba ..................... G11C 5/063 |
| | | | 257/690 |
| 2016/0240497 | A1 * | 8/2016 | Chen ................... H01L 25/0655 |
| 2017/0110159 | A1 * | 4/2017 | Hamada ................ G11C 5/025 |
| 2018/0331074 | A1 * | 11/2018 | Crisp ..................... H01L 24/49 |
| 2020/0003950 | A1 | 1/2020 | Yu et al. |
| 2020/0203311 | A1 * | 6/2020 | Koo .................. G06F 3/04164 |
| 2020/0402951 | A1 * | 12/2020 | Chen ...................... H01L 24/27 |

OTHER PUBLICATIONS

"Office Action of Taiwan Counterpart Application", dated Mar. 8, 2022, p. 1-p. 5.

* cited by examiner

INTERFACE OF INTEGRATED CIRCUIT DIE AND METHOD FOR ARRANGING INTERFACE THEREOF

BACKGROUND

Technical Field

The invention is related to fabrication of semiconductor device and more particularly to an interface of integrated circuit (IC) die and method for arranging the interface of IC die.

Description of Related Art

The digital electronic apparatus based on semiconductor integrated circuit such as mobile phones, digital cameras, personal digital assistants (PDAs), and so on are designed to have to be more powerful functionalities to adapt various applications in the modern digital world. However, the digital electronic apparatus as the trend in semiconductor fabrication intends to be smaller and lighter, with improved functionality and higher performance. The semiconductor device may be packaged into a 2.5D semiconductor device, in which several circuit chips may be integrated as a larger integrated circuit, in which the contact elements, interposer or RDL layer are used to connect between the chips.

The packaging technology Integrated Fan-Out (InFO) and chip-on-wafer-on-substrate (CoWoS) have been proposed to package multiple chips assembled side by side.

As to a whole electronic circuit, the main circuit may be fabricated based on the 2.5D packaging technology. In addition, multiple application-specific integrated circuits (ASIC) dies and serializer/deserialized (SerDes) dies may be additionally disposed on the main circuit in connection with each other through the interconnection interfaces, which involves a parallel bus.

The interfaces of two dies to be connected usually include contact element patterns, respectively, for connection to each other. The contact element pattern of a die includes a plurality of contact elements for connection to the contact elements of another die. How to arrange the contact element patterns for the die to improve the connect quality is still an issue to design.

SUMMARY

The invention provides an interface of IC die and a method for arranging the interface of IC die. The contact elements of the contact element pattern are configured to have a transmitting group and a receiving group. The contact elements for the transmitting group and the receiving group are symmetrically arranged. The dies may be easily disposed on interposer or RDL.

In an embodiment, the invention provides an interface of integrated circuit (IC) die includes a plurality of the contact elements formed as a contact element pattern corresponding to a parallel bus. The contact elements are arranged in an array of rows and columns and divided into a transmitting group and a receiving group. The contact elements of the transmitting group have a first contact element sequence and the contact elements of the receiving group has a second contact element sequence, the first contact element sequence is identical to the second contact element sequence. The contact elements with the first contact element sequence and the second contact element sequence are matched when the contact element pattern is geometrically rotated by 180° with respect to a row direction and a column direction.

In an embodiment, the invention provides a method for arranging an interface for an integrated circuit (IC) die. The invention includes configuring a plurality of the contact elements to form as a contact element pattern corresponding to a parallel bus, wherein the contact elements are arranged in an array of rows and columns and divided into a transmitting group and a receiving group. The contact elements of the transmitting group are assigned with a first contact element sequence and the contact elements of the receiving group are assigned with a second contact element sequence. The first contact element sequence is identical to the second contact element sequence. The contact elements with the first contact element sequence and the second contact element sequence are matched when the contact element pattern is geometrically rotated by 180° with respect to a row direction and a column direction.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 4 is a drawing, schematically illustrating the structure of the contact element pattern, according to an embodiment of the invention.

FIG. 5 is a drawing, schematically illustrating the configuration of the contact element pattern in transmitting group and receiving group, according to an embodiment of the invention.

FIG. 7 is a drawing, schematically illustrating the connection relation between the contact elements of the connected two dies with the symmetric contact element pattern, according to an embodiment of the invention.

DESCRIPTION OF THE EMBODIMENTS

The invention is directed to an interface for a 2.5D semiconductor device, in which dies are disposed on an interposer or RDL. The contact element patterns of the dies are configured to have geometrically symmetric relation. The dies are more freely connected through the interface. The routing lengths between contact elements in routing may also be more equally and shortly set.

Several embodiments are provided for describing the invention but the invention is not just limited to the embodiments.

Figure 1:
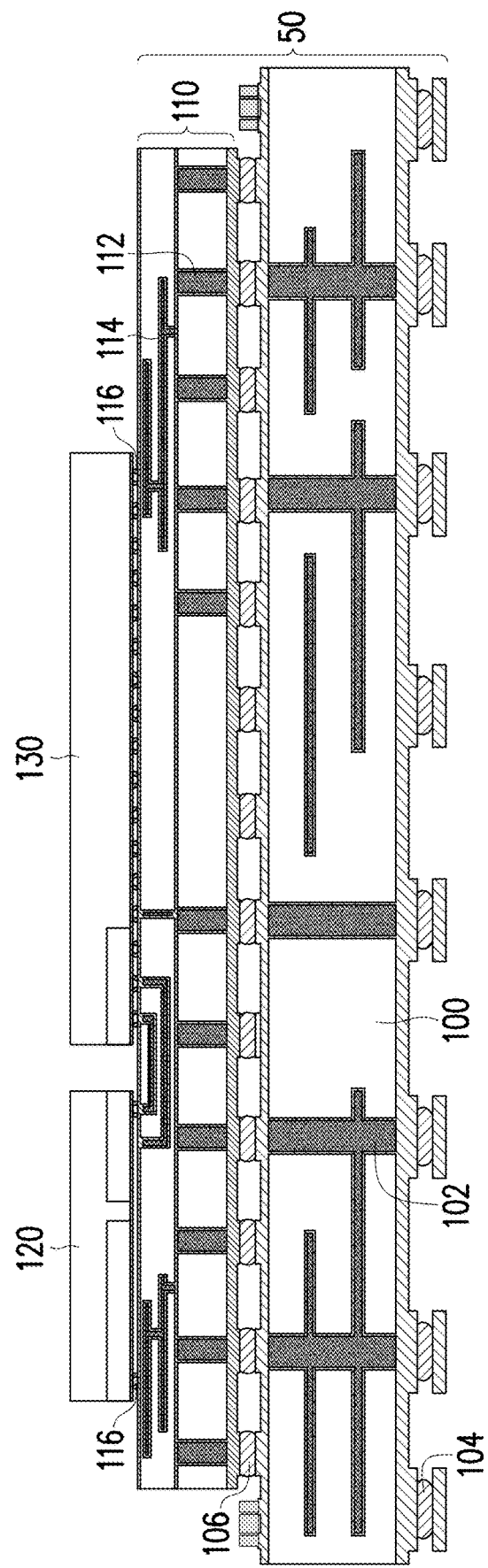
FIG. 1 is a drawing, schematically illustrating a cross-sectional stack structure of 2.5D semiconductor device with an interface, according to an embodiment of the invention.

FIG. 1 is a drawing, schematically illustrating a cross-sectional stack structure of 2.5D semiconductor device with an interface, according to an embodiment of the invention. Referring to FIG. 1, in further application, the CoWoS or InFO platform 50 with the intended IC structure is formed based on the 2.5D packaging technology. The CoWoS or InFO platform 50 may include a package substrate 100, which has the bottom solder balls 104 and the top C4 contact elements 106. The via 102 may be use for connecting from the bottom solder balls 104 to the top C4 contact elements 106. Further, interposer or RDL 110, may be further formed on the substrate 100 with the connection of the C4 contact elements 106. The interposer or RDL 110 may also include the TSV 112, the interconnection routing 114, and the contact elements 116. Here, the contact elements 116 depending on the fabrication process as taken may be via or bumping pad or any suitable connecting structure for terminal-to-terminal in contact. The invention does not limit the contact elements 106 as a specific type.

In actual application, the CoWoS or InFO platform 50 may also be implemented with additional dies, such as the ASIC die 130 and SerDes die 120. The ASIC die 130 and SerDes die 120 are connected through the routing 114 and the interface. One ASIC die 130 may connect with multiple SerDes die 120 for various peripheral communication.

Figure 2:
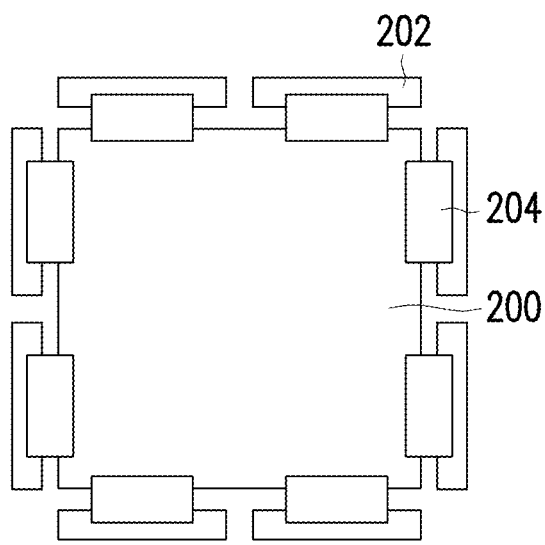
FIG. 2 is a drawing, schematically illustrating the interfaces for one die to connect to multiple other dies through the interfaces, according to an embodiment of the invention.

FIG. 2 is a drawing, schematically illustrating the interfaces for one die to connect to multiple other dies through the interfaces, according to an embodiment of the invention. Referring to FIG. 2, one IC die 200, such as a processor or ASIC die, may connect with multiple dies 202 through the interface 204. The interface 204 involves a parallel bus to communicate between the die 200 and the dies 202. The interface 204 may include routing and the contact elements in a contact element pattern, so that die 200 to die 202 may be connected.

Figure 3:
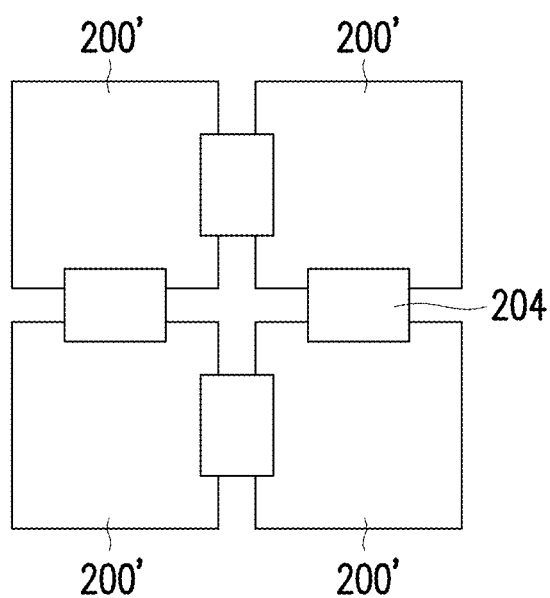
FIG. 3 is a drawing, schematically illustrating the interfaces for connection between multiple dies, according to an embodiment of the invention.

FIG. 3 is a drawing, schematically illustrating the interfaces for connection between multiple processor dies, according to an embodiment of the invention. Referring to FIG. 3, in another application, multiple processors 200' may be connected together to form a large processor with more powerful function. In this situation, these processors 200' are also connected by the interfaces 204.

As foregoing description, the 2.5D packaging process may be applied to stack various dies together side by side without substantially further consuming the device area. However, to allow the die to be more freely connected together, the contact elements in the interface 204 need to be properly arranged in compact manner and further be symmetric for receiving and transmitting signals. The communication between two die 200 to die 202 may be easily disposed at the peripheral region. Here, interface 204 may also referring to Glink interface as provided in the market.

Figures 4, 5:
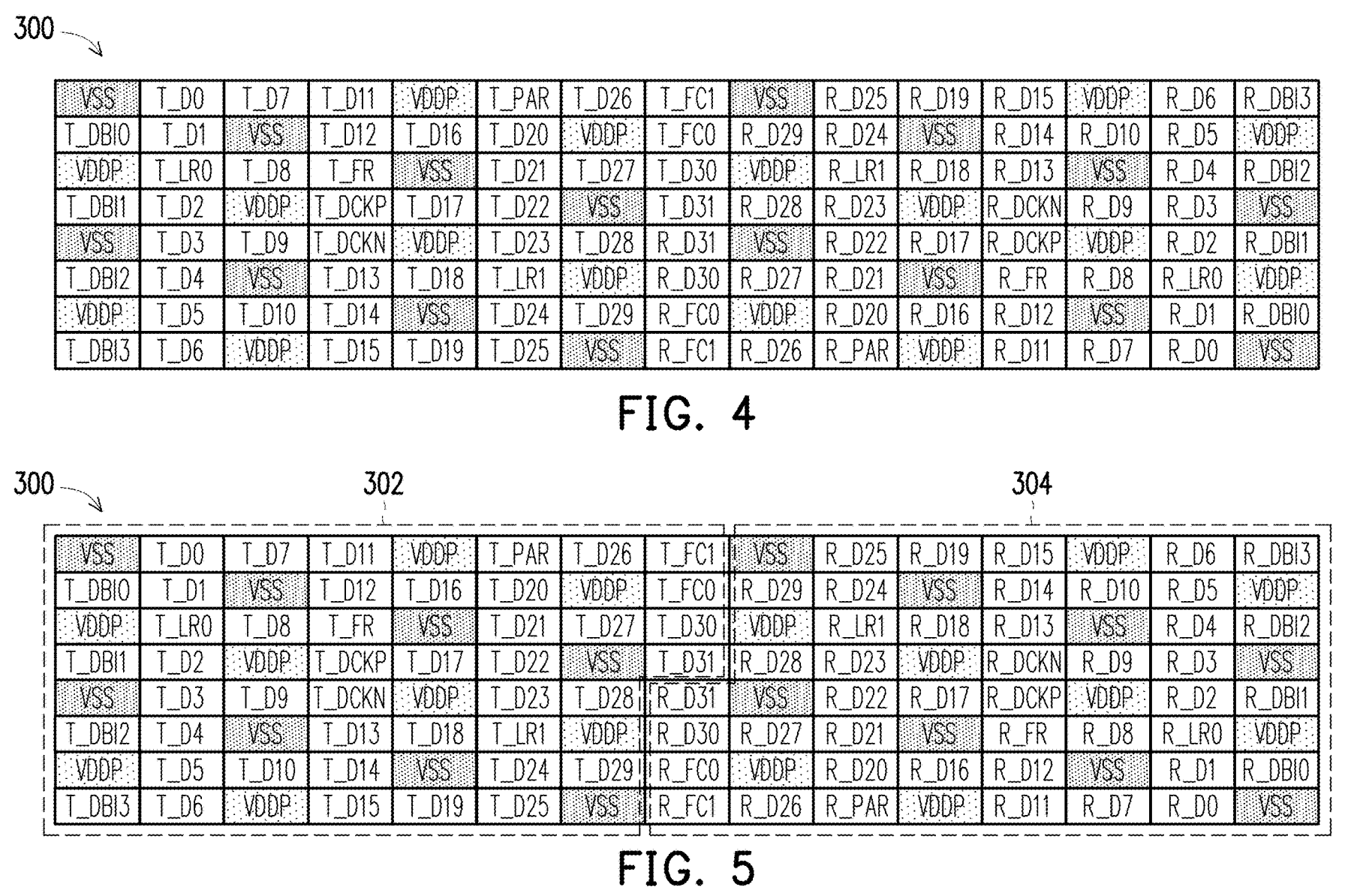

FIG. 4 is a drawing, schematically illustrating the structure of the contact element pattern, according to an embodiment of the invention. Referring to FIG. 4, the total number of the contact elements involved in the interface may be a number of signals are communicating in parallel for transmitting and receiving.

The total number of the contact elements involved in the interface may be a large number. The signals are communicating in parallel between dies for transmitting and receiving. Depending on the size of the data in one bus, a data size of 32 bits with operation voltages and other function signals are set as one slice referred to a contact element pattern 300.

The contact element pattern 300 may be replicated up to a certain number, such as 8, to adapt the total data size in parallel communication. In an example, the data is corresponding to 32 bits with a sequence of R_D0 to R_D31 and T_D0 to T_D31, on which T represents the contact element for transmitting and R represents the contact element for receiving. In addition, multiple low voltage signals VSS and multiple high voltage VDDP are also included in the contact element pattern 300. In addition, various function signals are also included, including FRAME T/R_FR; Clock T/R_DCKP/N; Flow control T/R_FC[1:0]; DBI T/R_DBI [3:0]; Parity T/R_PAR; and Lane Repair T/R_LR[1:0]. However, the contact elements for the functional signals are not just limited to the embodiments.

Table 1 is an example to define the contact elements for one transmitting (T) group or receiving (R) group. The transmitting group and the receiving group have the same number of contact elements.

TABLE 1

| Contact element type | number | definition |
| --- | --- | --- |
| Data, T/R [31:0] | 32 | Data bits synchronous to CLK |
| FRAME, T/R_FRAME | 1 | FRAME bit synchronous to CLK |
| Clock, T/R_DCK_P/N | 2 | CLK differential pair |
| Flow Control, T/R_FC[1:0] | 2 | Asynchronous and in different direction to data bus |
| DBI, T/R_DBI[3:0] | 4 | One DBI per byte, serving to invert bus content for better SSO (single sign-on) |
| Parity, T/R_PAR | 1 | One per 32 bits, serving to identify error cases |
| Lan Repair, T/R_LR[1:0] | 2 | Lane repair bits, being used to repair data, parity and DBI, not used to repair CLK, FRAME and FC signals |

As noted, each contact element is specifically defined with a function in use, so as to form a contact element sequence. The contact element sequence includes the data contact elements and various functional contact elements. In the example, the contact element pattern includes 8 rows and 15 columns to form a regular square or rectangle shape for an array.

FIG. 5 is a drawing, schematically illustrating the configuration of the contact element pattern in transmitting group and receiving group, according to an embodiment of the invention. Referring to FIG. 5, the contact elements are configured as an array with multiple rows and multiple columns, which is formed as a contact element pattern 300 for corresponding to a parallel bus in use for transmitting signals and receiving signals. The contact elements of the contact element pattern 300 are arranged in the array of rows and columns and divided into a transmitting group 302 and a receiving group 304. The contact elements of the transmitting group 302 are indicated by "T_" and contact elements of the receiving group 304 are indicated by "R_".

In the embodiment, the number N of rows be odd or even. In an embodiment, 8 rows are taken as an example. The number M of columns may be odd or even as well. In an embodiment, 15 columns are taken as an example. To have the compact arrangement, the central column may be divided into two parts for the transmitting group 302 and the receiving group 304. Generally, in an embodiment, the N and M may be even numbers or odd numbers. In an embodiment, the N is an even number and M are an odd number. In an embodiment, the N is an odd number and M are an even number.

However, the invention is not just limited to the embodiment. In an embodiment, the dummy contact element may also be involved to separate the transmitting group 302 and the receiving group 304. In other words, the number of the columns may be even, in which the dummy contact element may additionally added to clearly separate the transmitting group 302 and the receiving group 304. The invention is not limited to the embodiments.

The principle to assign the contact elements for the transmitting group 302 and the receiving group 304 is get symmetric for the transmitting group 302 and the receiving group 304. Ignoring the transmitting indication "T_" and the receiving indication "R_", contact element sequences of the transmitting group 302 and the receiving group 304 are the same. In other word, when the contact element pattern 300 is rotated by 180° taking the row direction as the rotation axis and the contact element pattern 300 is further rotated by 180° taking the column direction as the rotation axis, then the contact element sequences are identical.

In an example, taking the contact element R_DBI3 at the left-up corner of the receiving group 304 as an example, after rotation, it would match to the contact element T_DBI3 of the transmitting group 302. As a result, a transmitting contact element in contact element sequence of one die is matched to a receiving contact element of another die.

Figure 6:
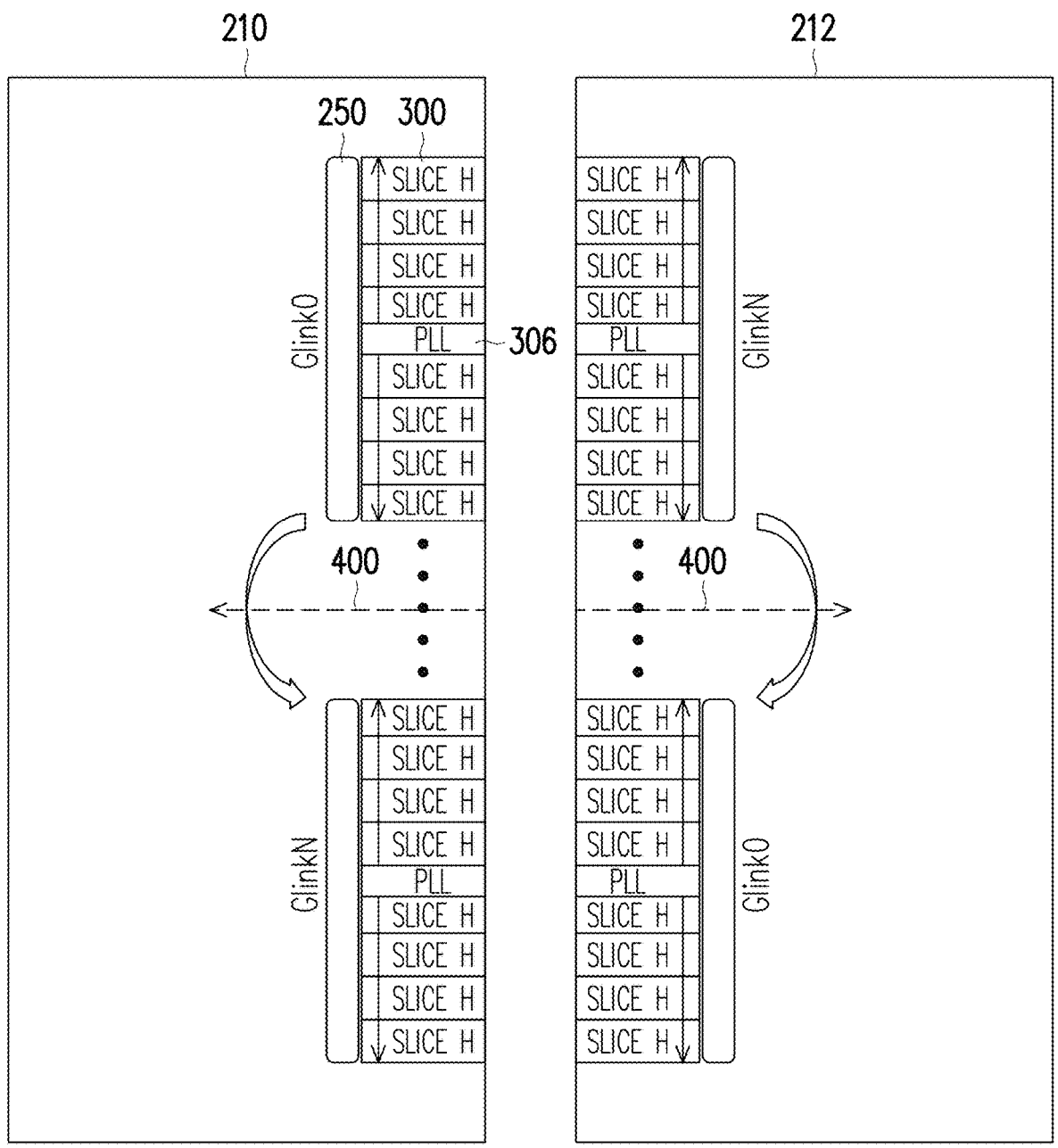
FIG. 6 is a drawing, schematically illustrating a connection between dies, according to an embodiment of the invention.

FIG. 6 is a drawing, schematically illustrating a connection between dies, according to an embodiment of the invention. Referring to FIG. 6, based on the contact element pattern 300 for one interface slice H, the actual interface includes multiple interface slices H for one interface 250. N interfaces as indicated by Glink0 to Glink N are taken for descriptions, in an example. The die 210 may include multiple interfaces 250 for different communications with the die 212. In an embodiment, one die 210 and another die 212 are taken as an example. The die 210 includes multiple interfaces 250 of Glink0 to Glink N 250. The die 212 also includes multiple interfaces 250 of Glink0 to Glink N. Each of the interfaces 250, Glink0 to Glink N, in an example may include 8 interface slices H. Each slice H has the contact element pattern 300 with the contact elements in symmetric arrangement. According to the actual need, an additional function slice 306 may be implemented at the center between the slices H. The function slice 306 may be related to a phase locked loop (PLL) in an example for proving timing signals. The invention is not just limited to the function slice 306 in the embodiment.

When the die 212 in packaging process is disposed onto the main die, even if the die 212 is rotated by 180° with respect to the axis 400, the contact element patterns of the die 212 with the symmetric arrangement may still easily be matched to the contact element patterns of the die 210. In an example, the interface Glink0 of the die 210 is matched to the interface GlinkN of the die 212. Likewise, the interface Glink1 of the die 210 is matched to the interface GlinkN−1 of the die 212, and so on. In other words, even if the die 212 is rotated due to the need of the packaging process, the contact element pattern of each slice H of the die 210 allows the contact element to be matched to the slice H of the other die 212.

Further, the axis 400 may be extending along the X-axis direction or the Y-axis direction. In addition, according to FIG. 2 and FIG. 3 as the example, multiple axes 400 may be involved, extending along both the X-axis direction and the Y-axis direction. However, the symmetric property for the contact element pattern still remain.

Figure 7:
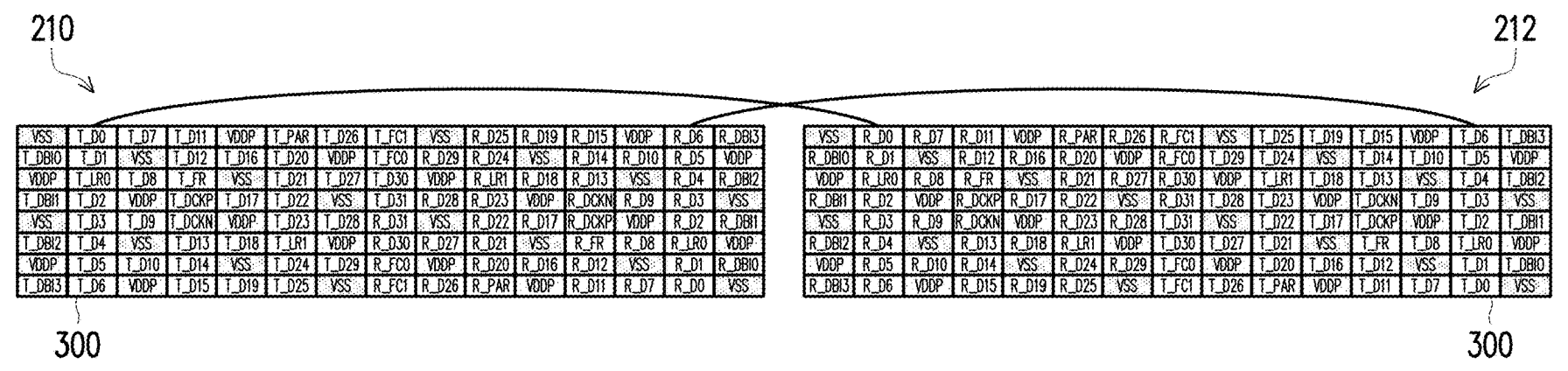

FIG. 7 is a drawing, schematically illustrating the connection relation between the contact elements of the connected two dies with the symmetric contact element pattern, according to an embodiment of the invention. Referring to FIG. 7, taking one bonding pattern 300 for the die 210 and the die 212 as an example for further descriptions, the trace paths between the contact elements with the contact element sequence as assigned in the contact element pattern 300 are illustrated.

Due to the symmetric property, the contact element sequence of the contact element pattern 300 of the die 212, due to the rotation as needed in packaging process, is identical the contact element sequence of the contact element pattern 300 of the die 210, expect that the transmitting group "T_" is corresponding to the receiving group "R_". In an example, the contact element T_D0 of the die 210 is connected to the contact element R_D0 of the die 212 and the contact element R_D6 of the die 210 is connected to the contact element T_D6 of the die 212.

Figure 8:
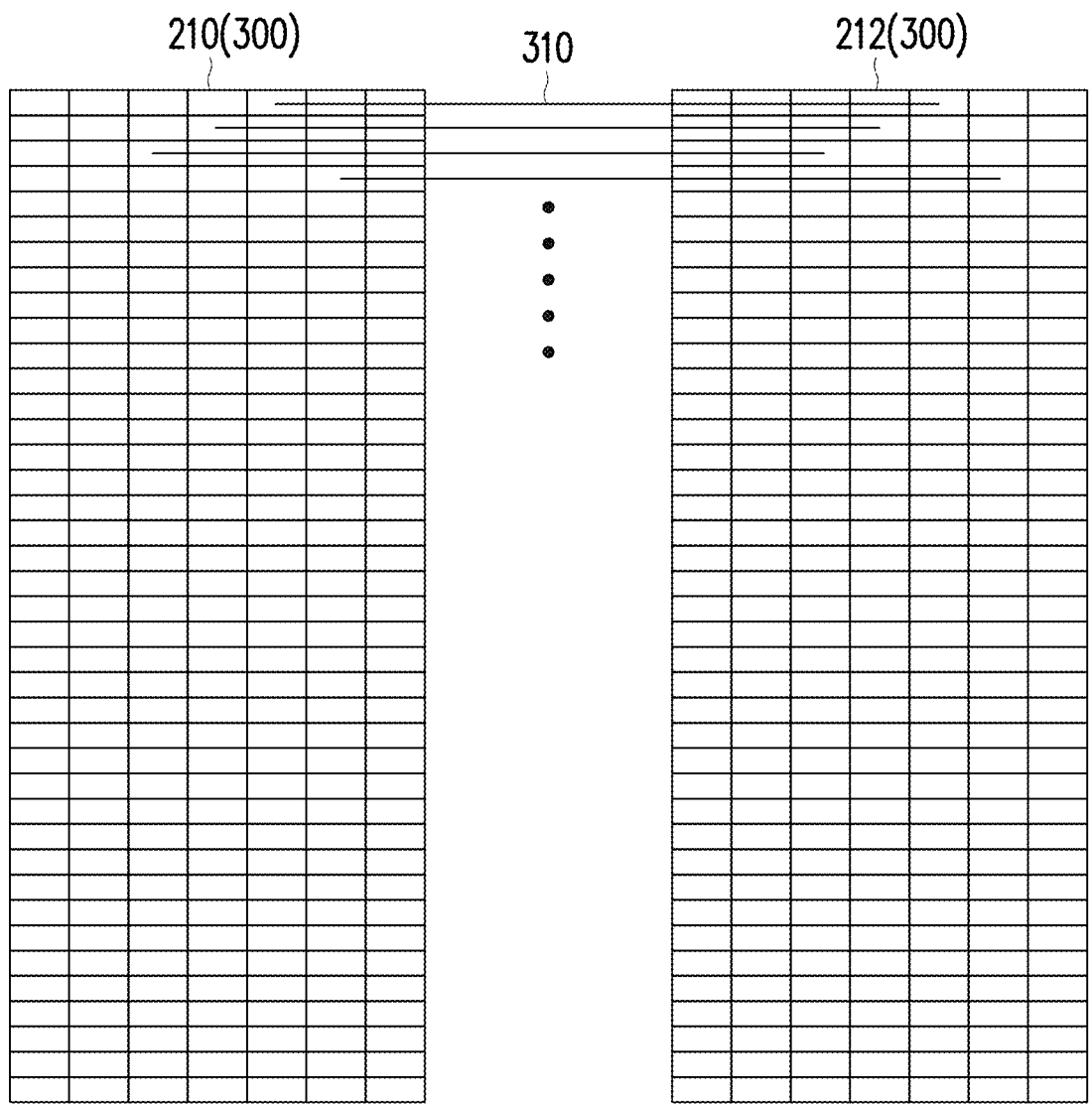
FIG. 8 is a drawing, schematically illustrating a routing effect between the connected two dies with the symmetric contact element pattern, according to an embodiment of the invention.

FIG. 8 is a drawing, schematically illustrating a routing effect between the connected two dies with the symmetric contact element pattern, according to an embodiment of the invention. Referring to FIG. 7 and FIG. 8, the trace paths 310 between the contact elements of the die 210 and the die 212 may be kept by substantially equal length. These features of the contact element pattern may provide the advantages. Due to equal length of connections synchronous parallel bus from GLink TX arrives to GLink RX fully synchronous with minimal time difference between bits. It allows GLink RX receiver to sample the parallel bus synchronously and to achieve high quality of sampling at high frequency.

As also referring to FIG. 3, the die 210 may be the ASIC die 130 and the die 212 may be the SerDes dies 120. The connection in FIG. 2 and FIG. 3 may also be taken in the examples.

The invention has provided the contact element pattern with the symmetric arrangement.

In an embodiment, the invention provides an interface of integrated circuit (IC) die includes a plurality of the contact elements formed as a contact element pattern corresponding to a parallel bus. The contact elements are arranged in an array of rows and columns and divided into a transmitting group and a receiving group. The contact elements of the transmitting group have a first contact element sequence and the contact elements of the receiving group has a second contact element sequence. The first contact element sequence is identical to the second contact element sequence. The contact elements with the first contact element sequence and the second contact element sequence are matched when the contact element pattern is geometrically rotated by 180° with respect to a row direction and a column direction.

In an embodiment, the invention provides a method for arranging an interface for an integrated circuit (IC) die. The invention includes configuring a plurality of the contact elements to form as a contact element pattern corresponding to a parallel bus, wherein the contact elements are arranged in an array of rows and columns and divided into a transmitting group and a receiving group. The contact elements of the transmitting group are assigned with a first contact element sequence and the contact elements of the receiving group are assigned with a second contact element sequence. The first contact element sequence is identical to the second contact element sequence. The contact elements with the first contact element sequence and the second contact element sequence are matched when the contact element pattern is geometrically rotated by 180° with respect to a row direction and a column direction.

In an embodiment, each of the transmitting group and the receiving group includes a set of data contact elements and a plurality of functional contact elements, and voltage contact elements.

In an embodiment, the transmitting group and the receiving group are located at two sides of the contact element pattern along a row direction and are joined together.

In an embodiment, the contact element pattern has N rows and M columns in a square shape or a rectangular shape. In an embodiment, the N and M may be even numbers or odd numbers. In an embodiment, the N is an even number and M are an odd number. In an embodiment, the N is an odd number and M are an even number.

In an embodiment, a central column of the contact element pattern is equally divided into two parts for the transmitting group and the receiving part.

In an embodiment, the N is equal to 8 and the M is equal to 15 for transmitting/receiving data with a size of 32 bits.

In an embodiment, the interface includes a plurality of contact element patterns.

In an embodiment, the interface includes a plurality of interface slices and each of the interface slices comprises the contact element pattern.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An interface between a plurality of integrated circuit (IC) dies, comprising:
    a first interface of the plurality of IC dies; and
    a second interface of the plurality of IC dies,
    each of the first interface and the second interface comprising:
        a plurality of the contact elements formed as a contact element pattern corresponding to a parallel bus, wherein the contact elements are arranged in an array of rows and columns and divided into a transmitting group and a receiving group,
    wherein the contact elements of the transmitting group has a first contact element sequence and the contact elements of the receiving group has a second contact element sequence, the first contact element sequence is identical to the second contact element sequence,
    wherein the contact elements with the first contact element sequence and the second contact element sequence are matched when the contact element pattern are geometrically rotated by 180° with respect to a row direction and a column direction,
    wherein the transmitting group and the receiving group are located at two sides of the contact element pattern along a row direction and are joined together,
    wherein the contact elements of the transmitting group of the first interface are matched with the contact elements of the receiving group of the second interface.

2. The interface between the plurality of IC dies as recited in claim 1, wherein each of the transmitting group and the receiving group includes a set of data contact elements and a plurality of functional contact elements, and voltage contact elements.

3. The interface between the plurality of IC dies as recited in claim 1, wherein the contact element pattern has N rows and M columns in a square shape or a rectangular shape, wherein the N and M are integer.

4. The interface between the plurality of IC dies as recited in claim 3, wherein the N and M are even numbers or odd numbers.

5. The interface between the plurality of IC dies as recited in claim 3, wherein the N is an even number and the M is an odd number or the N is an odd number and the M is an even number.

6. The interface between the plurality of IC dies as recited in claim 5, wherein a central column of the contact element pattern is equally divided into two parts for the transmitting group and the receiving part.

7. The interface between the plurality of IC dies as recited in claim 6, wherein the N is equal to 8 and the M is equal to 15 for transmitting/receiving data with a size of 32 bits.

8. The interface between the plurality of IC dies as recited in claim 1, wherein the interface includes a plurality of the contact element patterns.

9. The interface between the plurality of IC dies as recited in claim 1, wherein the interface includes a plurality of interface slices and each of the interface slices comprises the contact element pattern.

10. A method for arranging an interface between a plurality of integrated circuit (IC) dies, the interface comprising a first interface of one in the plurality of IC dies and a second interface of another one in the plurality of IC dies, the method comprising:
    performing the following steps to each of the first interface and the second interface:
        configuring a plurality of the contact elements formed as a contact element pattern corresponding to a parallel bus, wherein the contact elements are arranged in an array of rows and columns and divided into a transmitting group and a receiving group;
        assigning the contact elements of the transmitting group with a first contact element sequence and the contact elements of the receiving group with a second contact element sequence, wherein the first contact element sequence is identical to the second contact element sequence,
    wherein the contact elements with the first contact element sequence and the second contact element sequence are matched when the contact element pattern are geometrically rotated by 180° with respect to a row direction and a column direction,
    wherein the transmitting group and the receiving group are located at two sides of the contact element pattern along a row direction and are joined together,
    wherein the contact elements of the transmitting group of the first interface are matched with the contact elements of the receiving group of the second interface.

11. The method for arranging the interface between the plurality of IC dies as recited in claim 10, wherein each of the transmitting group and the receiving group as arranged includes a set of data contact elements and a plurality of functional contact elements, and voltage contact elements.

12. The method for arranging the interface between the plurality of IC dies as recited in claim 10, wherein the contact element pattern as arranged has N rows and M columns in a square shape or a rectangular shape, wherein the N and M are integer.

13. The method for arranging the interface between the plurality of IC dies as recited in claim 12, wherein the N and the M are configured to have even numbers or odd numbers.

14. The method for arranging the interface between the plurality of IC dies as recited in claim 12, wherein the N is configured to be an even number and the M is configured to be an odd number or the N is configured to be an odd number and the M is configured to be an even number.

15. The method for arranging the interface between the plurality of IC dies as recited in claim 14, wherein a central column of the contact element pattern is equally divided into two parts for the transmitting group and the receiving part.

16. The method for arranging the interface between the plurality of IC dies as recited in claim 10, wherein the N is equal to 8 and the M is equal to 15 for transmitting/receiving data with a size of 32 bits.

17. The method for arranging the interface between the plurality of IC dies as recited in claim 10, wherein the interface includes a plurality of the contact element patterns.

18. The method for arranging the interface between the plurality of IC dies as recited in claim 10, wherein the interface includes a plurality of interface slices and each of the interface slices comprises the contact element pattern.

* * * * *